United States Patent
Dan et al.

(10) Patent No.: US 11,309,598 B2
(45) Date of Patent: Apr. 19, 2022

(54) HEATING CONTROL METHOD AND HEATING CONTROL DEVICE

(71) Applicant: Contemporary Amperex Technology Co., Limited, Ningde (CN)

(72) Inventors: Zhimin Dan, Ningde (CN); Wenbin Lu, Ningde (CN); Wei Zhang, Ningde (CN); Yizhen Hou, Ningde (CN); Teng Yu, Ningde (CN); Xiyang Zuo, Ningde (CN); Xingyuan Wu, Ningde (CN); Taosheng Zhu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 237 days.

(21) Appl. No.: 16/233,096

(22) Filed: Dec. 27, 2018

(65) Prior Publication Data
US 2019/0363408 A1    Nov. 28, 2019

(30) Foreign Application Priority Data
May 22, 2018    (CN) .......................... 201810495990.9

(51) Int. Cl.
*H01M 10/615*    (2014.01)
*H01M 10/651*    (2014.01)
(Continued)

(52) U.S. Cl.
CPC ....... *H01M 10/615* (2015.04); *H01M 10/425* (2013.01); *H01M 10/651* (2015.04);
(Continued)

(58) Field of Classification Search
None
See application file for complete search history.

(56) References Cited

U.S. PATENT DOCUMENTS 5,789,092 A    8/1998    Spiers et al.
2006/0290325 A1*    12/2006    Ashtiani .......... H02M 7/53871
322/33

(Continued)

FOREIGN PATENT DOCUMENTS

CN    101013765 A    8/2007
CN    102074753 A    5/2011
(Continued)

OTHER PUBLICATIONS

The extended European Search Report for European Application No. 19150225.1, dated Jul. 10, 2019, 9 pages.
(Continued)

*Primary Examiner* — Ula C Ruddock
*Assistant Examiner* — Anna Korovina
(74) *Attorney, Agent, or Firm* — Law Offices of Liaoteng Wang (57) ABSTRACT

The present disclosure provides a heating control method and a heating control device. The heating control method includes: acquiring an average current value in a heating circuit of a power battery pack; calculating a current output value required for $n^{th}$ cycle according to an average current value of the $n^{th}$ cycle, an average current value of $(n-1)^{th}$ cycle, an average current value of $(n-2)^{th}$ cycle, a preset current value, n is equal to or greater than 3; outputting a PWM signal to a switch device of the heating circuit according to a pre-calibrated PWM control parameter corresponding to the current output value so that a difference between an actual current value in the heating circuit and the preset current value is less than a preset threshold.

8 Claims, 4 Drawing Sheets

(51) Int. Cl.
*H01M 10/6571* (2014.01)
*H01M 10/42* (2006.01)
*G01R 31/382* (2019.01)
*G01R 19/165* (2006.01)

(52) U.S. Cl.
CPC ... *H01M 10/6571* (2015.04); *G01R 19/16528* (2013.01); *G01R 31/382* (2019.01); *H01M 2010/4271* (2013.01)

(56) References Cited

U.S. PATENT DOCUMENTS

| | | | | |
|---|---|---|---|---|
| 2011/0084667 | A1* | 4/2011 | Li | H02J 7/0029 320/145 |
| 2016/0132458 | A1* | 5/2016 | Kim | G06F 13/4282 710/106 |
| 2017/0358832 | A1* | 12/2017 | Sun | B60L 50/66 |

FOREIGN PATENT DOCUMENTS

| | | |
|---|---|---|
| CN | 105529508 A | 4/2016 |
| CN | 105742758 A | 7/2016 |
| CN | 106785233 A | 5/2017 |
| CN | 107171041 A | 9/2017 |
| CN | 107317066 A | 11/2017 |
| CN | 107482259 A | 12/2017 |
| CN | 107591589 A | 1/2018 |
| CN | 107910617 A | 4/2018 |
| EP | 1026769 A2 | 8/2000 |
| JP | 2018026298 A | 2/2018 |
| WO | 2016000492 A1 | 1/2016 |

OTHER PUBLICATIONS

The First Official Action and search report dated Jul. 29, 2019 for Chinese application No. 201810495990.9, 7 pages.
The Notice of Allowance and supplementary search report for Chinese Application No. 201810495990.9, dated Feb. 3, 2020, 4 pages.

* cited by examiner

HEATING CONTROL METHOD AND HEATING CONTROL DEVICE

CROSS-REFERENCE TO RELATED APPLICATION

The present application is based upon and claims benefits of the Chinese patent application No. 201810495990.9, filed on May 22, 2018, contents of which are incorporated herein by reference in its entirety.

TECHNICAL FIELD

The disclosure relates to the technical field of battery, and in particular, to a heating control method and a heating control device.

BACKGROUND

When a power battery pack has a temperature lower than a lower limit of an allowable operating temperature range, the power battery pack cannot work and needs to be heated to a temperature within the allowable operating temperature range before it resumes its operations.

At present, a method for heating a power battery pack includes: controlling a switch device to instantaneously short a power battery to form a heating circuit, such that an internal resistance of the power battery generates heat when a large current generated by instantaneous shorting flows through the internal resistance, thereby heating the power battery. This solution has advantages of high heating speed and even heating. Commonly used switch devices include Insulated Gate Bipolar Transistors (IGBTs).

However, inventors of the application have found that IGBT's operations are controlled mainly by way of internal resistances of the power battery pack in related art, but such method can only indirectly adjust heating current in the heating circuit and has lower control accuracy.

SUMMARY

Embodiments of the invention provide a heating control method and a heating control device that can improve accuracy of controlling current in a heating circuit of a battery pack.

According to an aspect of the invention, there is provided a heating control method. The method includes: acquiring an average current value in a heating circuit of a power battery pack; calculating a current output value required for $n^{th}$ cycle according to an average current value of the $n^{th}$ cycle, an average current value of $(n-1)^{th}$ cycle, an average current value of $(n-2)^{th}$ cycle and a preset current value, n is equal to or greater than 3; and outputting a Pulse width Modulation (PWM) signal to a switch device of the heating circuit according to a pre-calibrated PWM control parameter corresponding to the current output value so that a difference between an actual current value in the heating circuit and the preset current value is less than a preset threshold.

According to a second aspect of embodiments of the invention, there is provided a heating control device. The heating control device includes: an acquisition module configured to acquiring an average current value in a heating circuit of a power battery pack; a calculation module configured to calculate a current output value required for $n^{th}$ cycle according to an average current value of the $n^{th}$ cycle, an average current value of $(n-1)^{th}$ cycle, an average current value of $(n-2)^{th}$ cycle and a preset current value, n is equal to or greater than 3; a control module configured to output a Pulse width Modulation (PWM) signal to a switch device of the heating circuit according to a pre-calibrated PWM control parameter corresponding to the current output value so that a difference between an actual current value in the heating circuit and the preset current value is less than a preset threshold.

In a possible implementation of the second aspect, the heating control device may further include: a determination module configured to: for each state of charge section, continuously adjust value of the PWM control parameter, and determine a value of the PWM control parameter when the average current value of the heating circuit reaches to be constant as a PWM control parameter corresponding to the current output value.

According to a third aspect of embodiments of the invention, there is provided a heating control device. The heating control device includes: a memory and a processor. The memory is configured to store executable program codes. The processor is configured to read the executable program codes stored in the memory to perform a heating control method according to embodiments of the present disclosure.

BRIEF DESCRIPTION OF THE DRAWINGS

The invention may be better understood from the following descriptions of specific embodiments of the present disclosure taken in conjunction with the accompanying drawings, in which the same or similar reference numerals represent the same or similar features.

DETAILED DESCRIPTION

Features and exemplary embodiments of various aspects of the invention are described in detail below. In the following detailed descriptions, numerous specific details are set forth in order to provide a thorough understanding of the present disclosure.

The embodiments of the present disclosure provide a heating control method and a heating control device for controlling current in a heating circuit of a power battery pack, which has a higher control accuracy and can achieve rapid heating of the battery under safety and reliability.

From a scale, a power battery pack consists of at least two battery cells in series and/or in parallel. The battery cell in embodiments of the present disclosure may be a lithium ion battery, a lithium metal battery, a lead-acid battery, a nickel-interval battery, a nickel-hydrogen battery, a lithium-sulfur battery, a lithium air battery, or a sodium ion battery, which is not limited herein.

Figure 1:
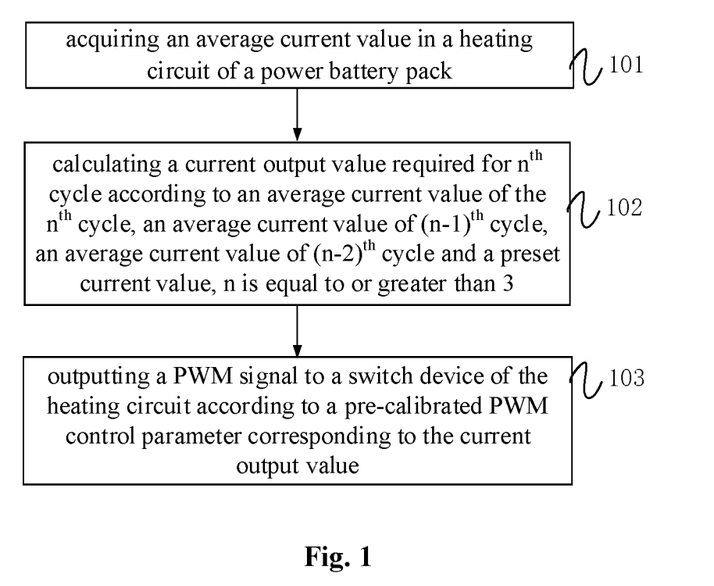
FIG. 1 is a schematic flowchart of a heating control method according to some embodiments of the present disclosure.

FIG. 1 is a schematic flowchart of a heating control method according to some embodiments of the present disclosure. As shown in FIG. 1, the heating control method includes steps 101 to 103.

In step 101, an average current value in a heating circuit of a power battery pack is acquired.

The average current value refers to an average value of current sampling values over a period of time. By using calculation of an average current value, it is possible to avoid influence of instantaneous fluctuation of current on control accuracy.

In step 102, a current output value required for $n^{th}$ cycle is calculated according to an average current value of the $n^{th}$ cycle, an average current value of $(n-1)^{th}$ cycle, an average current value of $(n-2)^{th}$ cycle and a preset current value, wherein n is equal to or greater than 3.

In step 103, a Pulse width Modulation (PWM) signal is outputted to a switch device of the heating circuit according to a pre-calibrated PWM control parameter corresponding to the current output value so that a difference between an actual current value in the heating circuit and the preset current value is less than a preset threshold.

In general, switching frequency of an IGBT in a heating circuit for a power battery pack is generally in a range of 100 Hz to 1000 Hz. If frequency for the PWM signal is 1000 Hz and its duty cycle is 50%, it means that discharge process in the heating circuit takes 500 μs, and charging process take also 500 μs.

In some embodiments, current in the heating circuit may be sampled in real time by an Analog-to-Digital Converter (ADC) based on a 10 μs interrupt scheme, and data sampled in real-time may be uploaded to a control system through a Controller Area Network (CAN) message. An average value of 50 sampled data is taken as an average current value within 5001 μs for subsequent calculation to filter out influence of instantaneous fluctuation of the current on its control accuracy.

As described above, when current in the heating circuit needs to be controlled in the current cycle (for example, the $n^{th}$ cycle), an average current value in the $n^{th}$ cycle, an average current value in the $(n-1)^{th}$ cycle, an average current value in the $(n-2)^{th}$ cycle and a preset current value can be used to obtain a current output value for the $n^{th}$ cycle. After that, a PWM signal is outputted to a switching device of the heating circuit according to a pre-calibrated PWM control parameter corresponding to the current output value so that a difference between an actual current value in the heating circuit and the preset current value is less than a preset threshold. The preset threshold herein is an extremely small value such that actual current value of the heating circuit is infinitely close to the preset current value.

Since it is possible for embodiments of the present disclosure to directly control current in the heating circuit based on feedback current values in the heating circuit (for example, the average current value of the $n^{th}$ cycle, the average current value of the $(n-1)^{th}$ cycle, the average current value of the $(n-2)^{th}$ cycle) and a preset current value, the heating control method of embodiments of the present disclosure has a higher control accuracy as compared with that in related art where current in the heating circuit is indirectly controlled by controlling IGBT's operation by way of an internal resistance of the power battery pack, and can achieve rapid heating of the battery under safety and reliability.

Figure 2:
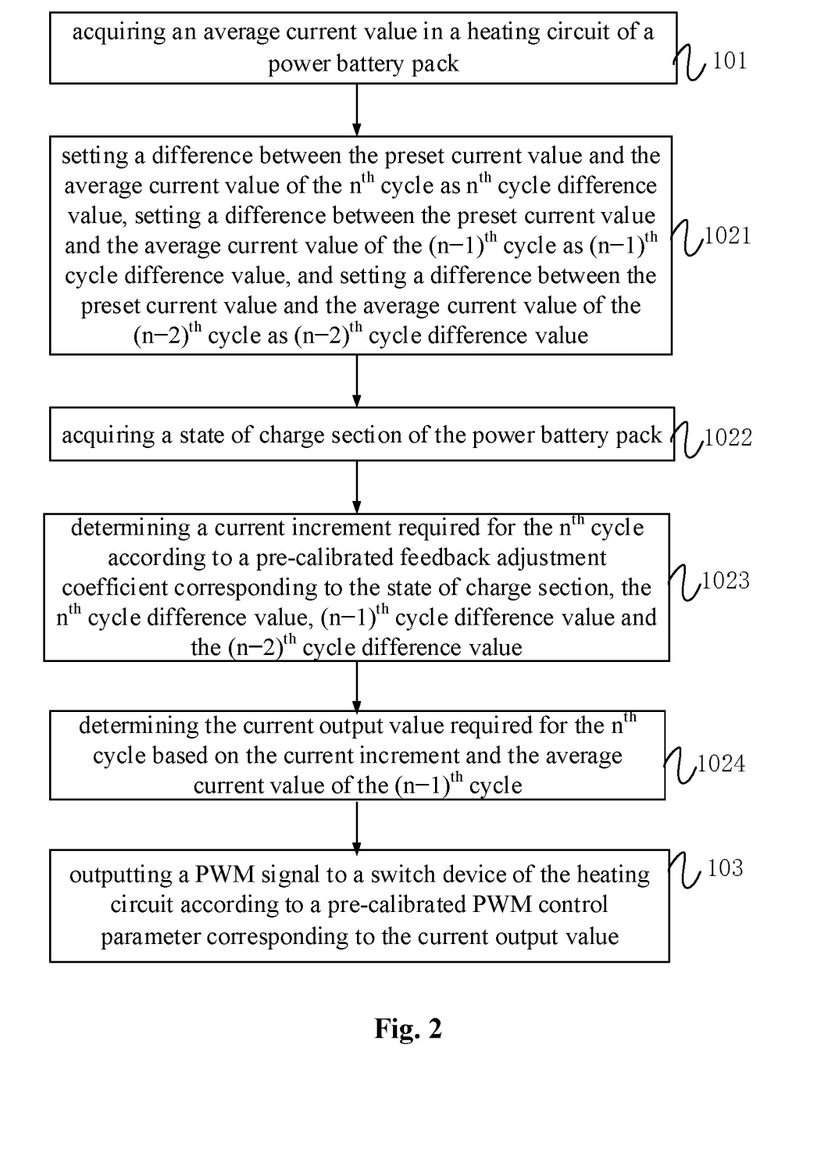
FIG. 2 is a schematic flowchart of a heating control method according to some embodiments of the present disclosure.

FIG. 2 is a schematic flowchart of a heating control method according to some embodiments of the present disclosure. FIG. 2 differs from FIG. 1 in that step 102 in FIG. 1 can be subdivided into step 1021 to step 1024 in FIG. 2.

In step 1021, a difference between the preset current value and the average current value of the $n^{th}$ cycle is set as $n^{th}$ cycle difference value, a difference between the preset current value and the average current value of the $(n-1)^{th}$ cycle is set as $(n-1)^{th}$ cycle difference value, and a difference between the preset current value and the average current value of the $(n-2)^{th}$ cycle is set as $(n-2)^{th}$ cycle difference value.

In step 1022, a state of charge section of the power battery pack is acquired.

In step 1023, a current increment required for the $n^{th}$ cycle is determined according to a pre-calibrated feedback adjustment coefficient corresponding to the state of charge section, the $n^{th}$ cycle difference value, $(n-1)^{th}$ cycle difference value and the $(n-2)^{th}$ cycle difference value.

In step 1024, the current output value required for the $n^{th}$ cycle is determined based on the current increment and the average current value of the $(n-1)^{th}$ cycle.

The feedback adjustment coefficient refers to a parameter for correcting an output current based on a feedback current value (such as an average current value of the $n^{th}$ cycle, an average current value of the $(n-1)^{th}$ cycle, and an average current value of the $(n-2)^{th}$ cycle) in a certain operation situation.

In some embodiments, the feedback adjustment coefficient may include a proportional adjustment coefficient $K_p$, an integral adjustment coefficient $K_i$, and a differential adjustment coefficient $K_d$. A feedback adjustment mode based on $K_p$, $K_i$, and $K_d$ is also referred to as a PID adjustment mode.

In embodiments of the present disclosure, it may be also required to determine relationship between state of charge sections of the power battery pack and feedback adjustment coefficients before step 1023.

Specifically, state of charge of the power battery pack may be divided into a plurality of sections from high to low. Each state of charge section may be equal or unequal. Then, a value of the feedback adjustment coefficient matched with each state of charge section is determined. By doing so, it is possible to avoid influence of the state of charge of the power battery pack on current control accuracy in the heating process, and thus to improve the current control accuracy.

In some embodiments, for calibration of $K_p$, value of $K_p$ is gradually increased from 0 until change rate of the average current value is greater than a first threshold determined based on a proportional adjustment coefficient, so as to determine relationship between the state of charge section and the proportional adjustment coefficient.

In some embodiments, for calibration of $K_i$, value of $K_i$ is gradually increased from 0 until fluctuation magnitude of the average current value is greater than a second threshold determined based on an integral adjustment coefficient, so as to determine relationship between the state of charge section and the integral adjustment coefficient.

In some embodiments, for calibration of $K_d$, value of $K_d$ is gradually increased from 0 until fluctuation magnitude of the average current value is greater than a third threshold determined based on a differential adjustment coefficient, so as to determine the relationship between the state of charge section and the differential adjustment coefficient.

It should be noted that the above calibration processes for $K_p$, $K_i$ and $K_d$ may be independent of each other, or may be combined with each other. For example, calibration of $K_i$ or $K_d$ may be on a basis of calibrated $K_p$, or calibration of $K_d$ may be on a basis of calibrated $K_p$ and $K_i$. Here, the second threshold and the third threshold may be equal or not equal, which depends on actual condition of the current in the heating circuit.

The following example illustrates calibration process for $K_p$, $K_i$, and $K_d$.

S1. Material and total capacity of the power battery pack is determined, and State of Charge (SOC) of the power battery pack is initialized to 100%.

S2. $K_i$ and $K_d$ are set to be 0. That is, for calibration of the proportional adjustment coefficient, the value of $K_p$ value is gradually increased from 0 in the absence of integral control and differential control. It is determined whether a change rate of the average current value meets a requirement (the change rate is greater than the above-mentioned first threshold). When the change rate satisfies the requirement, increasing of the value of $K_p$ value is stopped. The value of $K_p$ at this point is decreased by 10% in order to increase capability of fault tolerance of $K_p$.

S3. Value of $K_i$ is gradually increased from 0 until fluctuation of the average current value satisfies a requirement (the fluctuation amplitude is larger than the above-mentioned second threshold). The value of $K_i$ at this point is decreased by 10% in order to increase capability of fault tolerance of $K_i$.

S4. Value of $K_d$ is gradually increased from 0 until fluctuation of the average current value satisfies a requirement (the fluctuation amplitude is greater than the above-mentioned third threshold), increasing of the value of $K_d$ is stopped. The value of $K_d$ at this point is decreased by 10% in order to increase capability of fault tolerance of $K_d$.

S5. S2 to S4 are repeated each when the power battery pack is discharged by m % for further calibration until the power battery pack is discharged to 10%.

After the above five steps, a two-dimensional array of $((100-10)/m)*3$ is obtained for storing $K_p$, $K_i$, and $K_d$ values corresponding to different SOCs, wherein m represents a preset width of a divided state of charge section.

In embodiments of the present disclosure, since $K_p$, $K_i$, and $K_d$ suitable for each state of charge section are calibrated, it is possible to avoid influence of the state of charge of the power battery pack on current control accuracy in the heating process, and thus to improve the current control accuracy.

According to the closed-loop strategy in embodiments of the present disclosure, the inventor of the present application finds that under the premise that the state of charge of the power battery pack remains unchanged during the heating process of the power battery pack, it requires only a PWM signal is outputted at a constant period and a duty cycle to keep the output current value constant. For example, when the SOC is in a range of 80%-100% and if the PWM period is a constant value in a range of 10 ms to 20 ms and the duty cycle is a constant value in a range of 40% to 50%, the average output current is about a constant value within 150 A~170 A.

In some embodiments, it is possible to calibrate relationship between output current values and PWM control parameters in advance. PWM control parameter may include PWM period and duty cycle.

A method for calibrating the PWM control parameter may include: for each state of charge section, continuously adjusting value of the PWM control parameter, and determining a value of the PWM control parameter when the average current value of the heating circuit reaches to be constant as a PWM control parameter corresponding to the current output value.

The following example illustrates calibration process of PWM control parameters in detail.

S1. Material and total capacity of the power battery pack is determined, and State of Charge (SOC) of the power battery pack is initialized to 100%.

S2. PWM period and duty cycle are adjusted until the average current value in the heating circuit reaches a current value that is 0.8 times a maximum current limit value.

The maximum current limit value may be varied according to the SOC value.

S3. Respective PWM period and duty cycle are recorded.

S4. S2 to S4 are repeated each when the power battery pack is discharged by m % for further calibration until the power battery pack is discharged to 10%.

After the above four steps, respective period and duty cycle when the power battery pack is in different state of charge sections can be obtained.

A current control strategy for PID dynamic adjustment based on $K_p$, $K_i$, and $K_d$ in a heating circuit is described in detail with the expressions (1)-(4) below.

The proportional-integral-derivative control expression is as follows:

$$I(t) = K_p\left(e(t) + \frac{1}{T_i}\int_0^t e(t)dt + T_d \frac{de(t)}{dt}\right) \quad (1)$$

where $I(t)$ denotes average current value of $t^{th}$ cycle, $e(t)$ denotes average current deviation of $t^{th}$ cycle, $K_p$ denotes proportional control part, $T_i$ denotes integral time, $T_d$ denotes differential time, $\int_0^t e(t)dt$ denotes integral control part, an denotes differential control part, and $$\frac{de(t)}{dt}$$

denotes differential control part.

Assuming that a sampling interval for the average current value in the heating circuit is T, and a difference between an average current value for $k^{th}$ cycle and a preset current value is taken as an average current deviation $e(k)$ of the cycle, then:

the integral deviation at time point K is: $e(k)+e(k-1)+e(k-2)+ \ldots +e(0)$;

the derivative deviation at time point K is: $(e(k)-e(k-1))/T$;

Discretization of expression (1) yields:

$$I(k) = K_p\left(e(k) + \frac{T}{T_i}\sum_{s=0}^{k} e(n) + \frac{T_d}{T}(e(k) - e(k-1))\right) \quad (2)$$

where $K_p$ denotes a proportional adjustment coefficient, $$K_p \frac{T}{T_i}$$

denotes an integral adjustment coefficient $K_i$, and $$K_p \frac{T_d}{T}$$

denotes a differential adjustment coefficient $K_d$.

According to the expression (2), a proportional-integral-derivative control expression of the discretized sampling current of each of the $k^{th}$ cycle and the $(k-1)^{th}$ cycle can be obtained.

Further, the proportional-integral-derivative control expressions of discretized sampling current of the $k^{th}$ cycle and the $(k-1)^{th}$ cycle are subtracted to obtain a current increment between the $k^{th}$ cycle and the $(k-1)^{th}$ cycle, $\Delta i(k)$:

$$\Delta i(k)=K_p(e(k)-e(k-1))+K_ie(k)+K_d(e(k)-2e(k-1)+e(k-2)) \quad (3)$$

With expression (3), the average current value I(k) that needs to be outputted during the $k^{th}$ cycle can be obtained as:

$$I(k)=I(k-1)+K_p(e(k)-e(k-1))+K_ie(k)+K_d(e(k)-2e(k-1)+e(k-2)) \quad (4)$$

The following is a detailed description of the current control process for PID dynamic adjustment based on $K_p$, $K_i$, and $K_d$ in a heating circuit in conjunction with expressions (1)-(4).

S1: current value in the heating circuit is sampled by a heating control module (e.g. a heating control chip, HCM) in real time, and average current value I(k-1), average current error values (e(k), e(k-1) and e(k-2)) corresponding to respective $k^{th}$, $(k-1)^{th}$, $(k-2)^{th}$ cycles are calculated.

S2: according to a state of charge section of the power battery pack sent by the BMS, respective $K_p$, $K_i$ and $K_d$ values are acquired from the two-dimensional array obtained by calibration of the feedback adjustment coefficient.

S3: e(k), e(k-1), e(k-2), I(k-1) and $K_p$, $K_i$ and $K_d$ are substituted into expression (4) to obtain the average current value to be output in the $k^{th}$ cycle.

S4: according to a state of charge section of the power battery pack sent by the BMS, respective PWM period and the duty cycle are acquired from the two-dimensional array obtained by calibration of the PWM control parameter, and then a PWM signal is outputted.

Through the above steps S1-S4, it is possible to control heating such that average current can be maintained in a constant current state, and thereby quickly heating of the battery can be achieved under safety and reliability.

Figure 3:
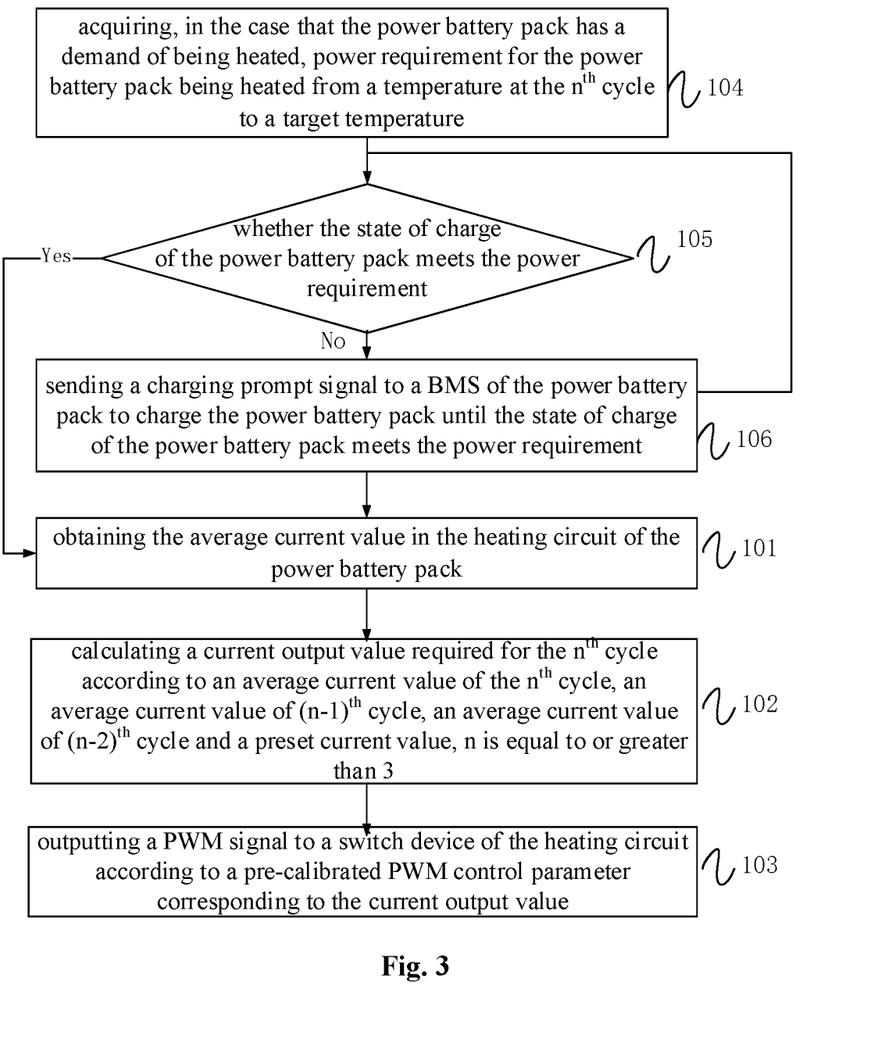
FIG. 3 is a schematic flowchart of a heating control method according to some embodiments of the present disclosure.

FIG. 3 is a schematic flowchart of a heating control method according to some embodiments of the present disclosure. FIG. 3 differs from FIG. 1 in that, prior to step 101 in FIG. 1, the heating control method in FIG. 3 further includes steps 104 to 106 for describing a startup strategy of the heating control method.

In step 104, in the case that the power battery pack has a demand of being heated, power requirement for the power battery pack being heated from a temperature at the $n^{th}$ cycle to a target temperature is acquired.

In step 105, it is determined whether the state of charge of the power battery pack meets the power requirement. If the state of charge of the power battery pack meets the power requirement, step 101 is performed; otherwise, step 106 is performed.

In step 106, a charging prompt signal is sent to a battery management system (BMS) of the power battery pack in order to charge the power battery pack until the state of charge of the power battery pack meets the power requirement.

Figure 4:
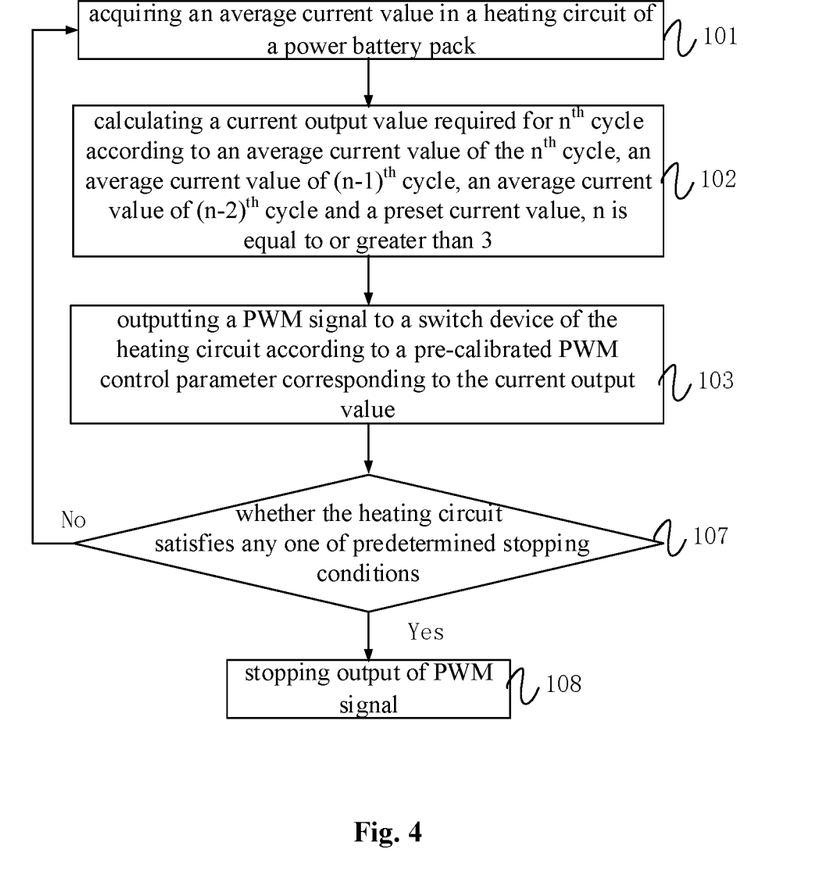
FIG. 4 is a schematic flowchart of a heating control method according to some embodiments of the present disclosure.

FIG. 4 is a schematic flowchart of a heating control method according to some embodiments of the present disclosure. FIG. 4 differs from FIG. 1 in that, after step 103 in FIG. 1, the heating control method in FIG. 4 further includes step 107 and step 108 for describing a stopping strategy of the heating control method.

In step 107, it is determined whether the heating circuit satisfies any one of predetermined stopping conditions. If the heating circuit satisfies any one of the predetermined stopping conditions, step 108 is performed; otherwise, step 101 is returned.

In step 108, output of the PWM signal is stopped.

In some embodiments, considering that precondition for dynamically adjusting the PWM wave for heating is that the power battery pack has normal parameters, the predetermined stopping condition may include: the average current value in the heating circuit is greater than an allowable current threshold (e.g., 80% of a fuse blown value), any cell in the power battery pack has a temperature and voltage greater than an allowable operating range, and temperature of the power battery pack reaches the target temperature.

In some embodiments, considering that the precondition for dynamically adjusting the PWM wave for heating further includes IGBT has normal parameters, the predetermined stopping condition may further include: surface temperature of the IGBT is greater than a set threshold $T_{set}$.

In some embodiments, considering that the precondition for dynamically adjusting the PWM wave for heating further includes communication line is in normal, the predetermined stopping condition may further include: temperature and voltage of any one of the battery cells sent by the BMS is out of the required heating range or is an invalid value.

As described above, by detecting voltage, temperature of cells in the heating circuit, state of charge of the power battery pack and surface temperature of the IGBT, it is possible to protect the system so that a real-time, safe and reliable heating system can be guaranteed.

Figure 5:
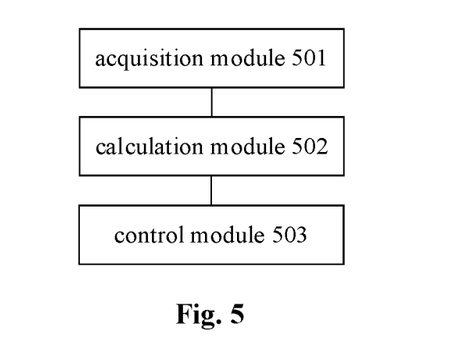
FIG. 5 is a schematic structural diagram of a heating control device according to some embodiments of the present disclosure.

FIG. 5 is a schematic structural diagram of a heating control device according to some embodiments of the present disclosure. As shown in FIG. 5, the heating control device includes an acquisition module 501, a calculation module 502, and a control module 503.

The acquisition module 501 is configured to obtain an average current value in a heating circuit of a power battery pack.

The calculation module 502 is configured to calculate a current output value required for $n^{th}$ cycle according to an average current value of the $n^{th}$ cycle, an average current value of $(n-1)^{th}$ cycle, an average current value of $(n-2)^{th}$ cycle and a preset current value, n is equal to or greater than 3.

The control module 503 is configured to output a Pulse width Modulation (PWM) signal to a switch device of the heating circuit according to a pre-calibrated PWM control parameter corresponding to the current output value so that a difference between an actual current value in the heating circuit and the preset current value is less than a preset threshold.

In some embodiments, the heating control device further includes a calibration module configured to: for each state of charge section, continuously adjust value of the PWM control parameter, and determine a value of the PWM control parameter when the average current value of the heating circuit reaches to be constant as a PWM control parameter corresponding to the current output value.

The embodiments of the present disclosure further provides a heating control device comprising a memory and a processor, wherein the memory is configured to store executable program codes, and the processor is configured to read the executable program codes stored in the memory to perform the above described heating control method.

It should be clear that the embodiments in this specification are described in a progressive manner, and the same or similar parts in each embodiment may be referred to each other, and each embodiment focuses on the difference from other embodiments. For device embodiments, relevant parts can be referred to the description of the method embodiments. The embodiments of the present disclosure are not limited to the specific steps and structures described above and shown in the drawings. Those skilled in the art can make various changes, modifications and additions or changing the order between steps after understanding the spirit of the embodiments of the present disclosure. Also, for the sake of brevity, detailed descriptions of known methods and techniques are omitted here.

The functional blocks shown in the block diagrams described above may be implemented as hardware, software, firmware, or a combination thereof. When implemented in hardware, it may be, for example, an electronic circuit, an application specific integrated circuit (ASIC), suitable firmware, plug-ins, function cards, and the like. When implemented in software, the elements of an embodiment of the present disclosure are programs or code segments that are used to perform the required tasks. Programs or code segments may be stored on a machine-readable medium or transmitted over a transmission medium or communication link via a data signal carried in a carrier wave. The "machine-readable medium" may include any medium that is capable of storing or transmitting information.

Examples of machine-readable media include electronic circuitry, semiconductor memory devices, ROMs, flash memory, erasable ROM (EROM), floppy disks, CD-ROMs, optical disks, hard disks, fiber optic media, radio frequency (RF) links, and the like. The code segments may be downloaded via a computer network such as the Internet, an intranet or the like.

The embodiments of the present disclosure may be implemented in other specific forms without departing from its spirit and essential characteristics. For example, the algorithms described in the specific embodiments may be modified without system architecture departing from the basic spirit of the embodiments of the present disclosure. As such, the embodiments are to be considered in all respects as illustrative and not restrictive, and the scope of the embodiments of the invention is defined by the appended claims rather than the foregoing descriptions. All changes that are defined in the meaning and the equivalents of the claims come within the scope of the embodiments of the invention.

What is claimed is:

1. A heating control method, comprising:
    acquiring, by a heating controlling device, an average current value in a heating circuit of a power battery pack based on currents sampled by an analog-to-digital converter, wherein the average current value comprises an average current value of an $n^{th}$ cycle, and an average current value of an $(n-1)^{th}$ cycle and an average current value of an $(n-2)^{th}$ cycle, wherein the n is equal to or greater than 3 and wherein each cycle is a period of time for current sampling;
    calculating, by the heating controlling device, a current output value required for the $n^{th}$ cycle according to the average current value of the $n^{th}$ cycle, the average current value of the $(n-1)^{th}$ cycle, the average current value of the $(n-2)^{th}$ cycle and a preset current value; and
    outputting, by the heating controlling device, a Pulse width Modulation (PWM) signal to a switch device of the heating circuit according to a pre-calibrated PWM control parameter, wherein the pre-calibrated PWM control parameter corresponds to the current output value required for the $n^{th}$ cycle,
    wherein an actual current value is generated in the heating circuit according to switching of the switch device based on the PWM signal, and wherein a difference between the actual current value and the preset current value is less than a preset threshold, and wherein the power battery pack is heated by a discharge process and a charging process with the generated actual current value;
    wherein the calculating of the current output value required for the $n^{th}$ cycle according to the average current value of the $n^{th}$ cycle, the average current value of the $(n-1)^{th}$ cycle, the average current value of the $(n-2)^{th}$ cycle and the preset current value comprises:
    setting a difference between the preset current value and the average current value of the $n^{th}$ cycle as an $n^{th}$ cycle difference value, setting a difference between the preset current value and the average current value of the $(n-1)^{th}$ cycle as an $(n-1)^{th}$ cycle difference value, and setting a difference between the preset current value and the average current value of the $(n-2)^{th}$ cycle as an $(n-2)^{th}$ cycle difference value;
    acquiring a state of charge section of the power battery pack from a battery management system;
    determining a current increment required for the $n^{th}$ cycle according to a pre-calibrated feedback adjustment coefficient corresponding to the state of charge section, the $n^{th}$ cycle difference value, the $(n-1)^{th}$ cycle difference value and the $(n-2)^{th}$ cycle difference value;
    determining the current output value required for the $n^{th}$ cycle based on the current increment and the average current value of the $(n-1)^{th}$ cycle.

2. The method according to claim 1, wherein before the determining of the current increment required for the $n^{th}$ cycle according to the pre-calibrated feedback adjustment coefficient corresponding to the state of charge section, the $n^{th}$ cycle difference value, the $(n-1)^{th}$ cycle difference value and the $(n-2)^{th\ cycle\ difference\ value}$, the method further comprises:
    determining a relationship between state of charge sections of the power battery pack and feedback adjustment coefficients, wherein the state of charge sections comprises the acquired state of charge section, and the feedback adjustment coefficients comprises the pre-calibrated feedback adjustment coefficient.

3. The method according to claim 2, wherein each of the feedback adjustment coefficients comprises a proportional adjustment coefficient, an integral adjustment coefficient and a differential adjustment coefficient, and the determining of the relationship between the state of charge sections of the power battery pack and the feedback adjustment coefficients comprises:
    for each of the state of charge sections, gradually increasing the proportional adjustment coefficient from 0 until a change rate of the average current value is greater than a first threshold determined based on the proportional adjustment coefficient, and determining a relationship between the state of charge section and the proportional adjustment coefficient;
    for each of the state of charge sections, gradually increasing the integral adjustment coefficient from 0 until fluctuation magnitude of the average current value is greater than a second threshold determined based on the integral adjustment coefficient, and determining a relationship between the state of charge section and the integral adjustment coefficient;

for each of the state of charge sections, gradually increasing the differential adjustment coefficient from 0 until the fluctuation magnitude of the average current value is greater than a third threshold determined based on the differential adjustment coefficient, and determining a relationship between the state of charge section and the differential adjustment coefficient.

4. The method according to claim 1, wherein before the outputting of the Pulse width Modulation (PWM) signal to the switch device of the heating circuit according to the pre-calibrated PWM control parameter, the method further comprises: for each of the state of charge sections, continuously adjusting a value of a PWM control parameter; and determining the value of the PWM control parameter when the average current value of the heating circuit reaches to be constant as the pre-calibrated PWM control parameter.

5. The method according to claim 1, wherein before the acquiring the average current value in the heating circuit of the power battery pack, the method further comprises:

acquiring, in the case that the power battery pack has a demand of being heated, power requirement for the power battery pack being heated from a temperature at the $n^{th}$ cycle to a target temperature;

determining whether the state of charge of the power battery pack meets the power requirement;

obtaining the average current value in the heating circuit of the power battery pack if the state of charge of the power battery pack meets the power requirement.

6. The method according to claim 5, wherein after the determining whether the state of charge of the power battery pack meets the power requirement, the method further comprises:

sending a charging prompt signal to a battery management system (BMS) of the power battery pack if the state of charge of the power battery pack does not meet the power requirement in order to charge the power battery pack until the state of charge of the power battery pack meets the power requirement.

7. The method according to claim 1, wherein after the outputting the Pulse width Modulation (PWM) signal to the switch device of the heating circuit according to the pre-calibrated PWM control parameter, the method further comprises:

stopping outputting the PWM signal if the heating circuit satisfies any one of predetermined stopping conditions including: the average current value in the heating circuit is greater than an allowable current threshold, any cell in the power battery pack has a temperature and voltage greater than an allowable operating range, and temperature of the power battery pack reaches the target temperature.

8. A non-transitory computer-readable storage medium having stored thereon computer instructions, that when executed by a processor, cause the processor to implement steps of the method according to claim 1.

* * * * *